(12) United States Patent
Chu et al.

(10) Patent No.: US 7,833,358 B2
(45) Date of Patent: Nov. 16, 2010

(54) METHOD OF RECOVERING VALUABLE MATERIAL FROM EXHAUST GAS STREAM OF A REACTION CHAMBER

(75) Inventors: Schubert S. Chu, San Francisco, CA (US); Frederick C. Wu, Cupertino, CA (US); Christophe Marcadal, Santa Clara, CA (US); Seshadri Ganguli, Sunnyvale, CA (US); Dien-Yeh Wu, San Jose, CA (US); Kavita Shah, Sunnyvale, CA (US); Paul Ma, Sunnyvale, CA (US)

(73) Assignee: Applied Materials, Inc., Santa Clara, CA (US)

( * ) Notice: Subject to any disclaimer, the term of this patent is extended or adjusted under 35 U.S.C. 154(b) by 1175 days.

(21) Appl. No.: 11/400,663

(22) Filed: Apr. 7, 2006

(65) Prior Publication Data

US 2007/0235059 A1 Oct. 11, 2007

(51) Int. Cl.
*B08B 7/00* (2006.01)
*B08B 9/00* (2006.01)

(52) U.S. Cl. .................... 134/1.1; 134/22.1; 438/905

(58) Field of Classification Search ................ None
See application file for complete search history.

(56) References Cited

U.S. PATENT DOCUMENTS

| 5,372,849 | A | 12/1994 | McCormick et al. |
| 5,962,716 | A | 10/1999 | Uhlenbrock et al. |
| 6,063,705 | A | 5/2000 | Vaartstra |
| 6,114,557 | A | 9/2000 | Uhlenbrock et al. |
| 6,338,991 | B1 | 1/2002 | Zhang et al. |
| 6,358,573 | B1 * | 3/2002 | Raoux et al. ............ 427/578 |
| 6,365,502 | B1 | 4/2002 | Paranjpe et al. |
| 6,423,619 | B1 | 7/2002 | Grant et al. |
| 6,440,495 | B1 | 8/2002 | Wade et al. |
| 6,458,183 | B1 * | 10/2002 | Phillips et al. ............ 75/631 |

(Continued)

FOREIGN PATENT DOCUMENTS

EP 1 293 509 5/2004

(Continued)

OTHER PUBLICATIONS

Aaltonen, et al. "Atomic Layer Deposition of Ruthenium from $RuCp_2$ and Oxygen: Film Growth and Reaction Mechanism Studies," Electrochemical Society Proceedings vol. 2003-08 pp. 946-953.

(Continued)

*Primary Examiner*—Michael Cleveland
*Assistant Examiner*—Nicole Blan
(74) *Attorney, Agent, or Firm*—Patterson & Sheridan, LLP

(57) ABSTRACT

A semiconductor processing chamber is cleaned by introducing a cleaning gas into a processing chamber, striking a plasma in a remote plasma source that is in communication with the processing chamber, measuring the impedance of the plasma, vaporizing a ruthenium containing deposit on a surface of the processing chamber to form a ruthenium containing gas mixture, and flowing the gas mixture through an analyzer and into an exhaust collection assembly. The measurement of the impedance of the plasma in combination with the ruthenium concentration provides an accurate indication of chamber cleanliness.

11 Claims, 3 Drawing Sheets

U.S. PATENT DOCUMENTS

| | | | |
|---|---|---|---|
| 6,462,367 B2 | 10/2002 | Marsh et al. | |
| 6,479,100 B2 | 11/2002 | Jin et al. | |
| 6,482,740 B2 | 11/2002 | Soininen et al. | |
| 6,506,352 B1 | 1/2003 | Lindfors et al. | |
| 6,517,616 B2 | 2/2003 | Marsh et al. | |
| 6,527,855 B2 | 3/2003 | Delarosa et al. | |
| 6,531,030 B1 | 3/2003 | Nakajima | |
| 6,536,602 B2 | 3/2003 | Kopetzky et al. | |
| 6,537,461 B1 * | 3/2003 | Nakahara et al. | 216/67 |
| 6,541,067 B1 | 4/2003 | Marsh et al. | |
| 6,576,778 B1 | 6/2003 | Uhlenbrock et al. | |
| 6,580,111 B2 | 6/2003 | Kim et al. | |
| 6,605,735 B2 | 8/2003 | Kawano et al. | |
| 6,610,568 B2 | 8/2003 | Marsh et al. | |
| 6,617,634 B2 | 9/2003 | Marsh et al. | |
| 6,627,995 B2 | 9/2003 | Paranipe et al. | |
| 6,713,373 B1 | 3/2004 | Omstead | |
| 6,737,317 B2 | 5/2004 | Marsh et al. | |
| 6,743,739 B2 | 6/2004 | Shimamoto et al. | |
| 6,744,138 B2 | 6/2004 | Marsh | |
| 6,780,758 B1 | 8/2004 | Derderian et al. | |
| 6,790,773 B1 | 9/2004 | Drewery et al. | |
| 6,800,542 B2 | 10/2004 | Kim | |
| 6,800,937 B2 | 10/2004 | Marsh et al. | |
| 6,887,795 B2 | 5/2005 | Soininen et al. | |
| 2001/0006838 A1 | 7/2001 | Won et al. | |
| 2001/0054730 A1 | 12/2001 | Kim et al. | |
| 2002/0000587 A1 | 1/2002 | Kim et al. | |
| 2002/0004293 A1 | 1/2002 | Soininen et al. | |
| 2002/0025627 A1 | 2/2002 | Marsh et al. | |
| 2002/0028556 A1 | 3/2002 | Marsh et al. | |
| 2002/0074577 A1 | 6/2002 | Marsh et al. | |
| 2002/0076881 A1 | 6/2002 | Marsh et al. | |
| 2002/0081381 A1 | 6/2002 | Delarosa et al. | |
| 2002/0102810 A1 | 8/2002 | Iizuka et al. | |
| 2002/0121697 A1 | 9/2002 | Marsh | |
| 2002/0125516 A1 | 9/2002 | Marsh et al. | |
| 2002/0173054 A1 | 11/2002 | Kim | |
| 2003/0032207 A1 * | 2/2003 | Rengarajan et al. | 438/14 |
| 2003/0037802 A1 | 2/2003 | Nakahara et al. | |
| 2003/0096468 A1 | 5/2003 | Soininen et al. | |
| 2003/0165615 A1 | 9/2003 | Aaltonen et al. | |
| 2003/0212285 A1 | 11/2003 | Uhlenbrock et al. | |
| 2004/0005753 A1 | 1/2004 | Kostamo et al. | |
| 2004/0038529 A1 | 2/2004 | Soininen et al. | |
| 2004/0105934 A1 | 6/2004 | Chang et al. | |
| 2004/0107897 A1 | 6/2004 | Lee et al. | |
| 2004/0149384 A1 * | 8/2004 | Kanno et al. | 156/345.24 |
| 2004/0241321 A1 | 12/2004 | Ganguli et al. | |
| 2005/0006799 A1 | 1/2005 | Gregg et al. | |
| 2005/0067098 A1 * | 3/2005 | Hughes et al. | 156/345.1 |
| 2005/0081882 A1 | 4/2005 | Greer et al. | |
| 2005/0238808 A1 | 10/2005 | Gatineau et al. | |

FOREIGN PATENT DOCUMENTS

| | | |
|---|---|---|
| EP | 1475825 A1 * | 11/2004 |
| JP | 2001-111000 | 4/2001 |
| JP | 2001-237400 | 8/2001 |
| WO | WO 01/88972 | 11/2001 |
| WO | WO 03/056612 | 7/2003 |
| WO | WO 2005/020317 | 3/2005 |

OTHER PUBLICATIONS

Aaltonen, et al. "Atomic Layer Deposition of Ruthenium Thin Films from Ru(thd)$_3$ and Oxygen," Chem. Vap. Deposition (2004), 10, No. 4 pp. 215-219.

Aaltonen, et al., "Ruthenium Thin Films Grown by Atomic Layer Deposition," Chem. Vap. Deposition (2003), 9, No. 1 pp. 45-49.

Aoyama, et al. "Ruthenium Films Prepared by Liquid Source Chemical Vapor Deposition Using Bis-(ethylcyclopentadienyl)ruthenium," Jpn. J. Appl. Phys. vol. 38 (1999) pp. L1134-L1136.

Dadgar, et al. "Growth of Ru doped semi-insulating InP by low pressure metalorganic chemical vapor deposition," Journal of Crystal Growth 195 (1998) pp. 69-73.

Goswami, et al. Transition Metals Show Promise as Copper Barriers, Semiconductor International, ATMI, San Jose—May 1, 2004.

Kwon, et al. "Atomic Layer Deposition of Ruthenium Thin Films for Copper Glue Layer," Journal of the Electrochemical Society, 151 (2) (2004) pp. G109-G112.

Kwon, et al. "Plasma-Enhanced Atomic Layer Deposition of Ruthenium Thin Films," Electrochemical and Solid-State Letters, 7 (4) (2004) pp. C46-C48.

Lashdaf, et al. "Deposition of palladium and ruthenium β-diketonates on alumina and silica supports in gas and liquid phase," Applied Catalysis A: General 241 (2003) pp. 51-63.

Lim, et al. "Atomic layer deposition of transition metals," Nature Materials, vol. 2 Nov. (2003) pp. 749-754.

Meda, et al. "Chemical Vapor Deposition of Ruthenium Dioxide Thin Films From Bis(2, 4-dimethylpentadienyl) Ruthenium," Chemical Aspects of Electronic Ceramics Processing, Symposium Mater. Res. Soc., Warrendale, PA, USA, 1998, pp. 75-80, XP009050315, ISBN: 1-55899-400-9.

Nakahara, et al. "Etching Technique for Ruthenium with a High Etch Rate and High Selectivity Using Ozone Gas," J. Vac. Sci.Technol. B 19(6), Nov./Dec. 2001, pp. 2133-2136.

Shibutami, et al. "A Novel Ruthenium Precursor for MOCVD without Seed Ruthenium Layer," TOSOH Research & Technology Review, vol. 47 (2003) pp. 61-64.

* cited by examiner

METHOD OF RECOVERING VALUABLE MATERIAL FROM EXHAUST GAS STREAM OF A REACTION CHAMBER

BACKGROUND OF THE INVENTION

1. Field of the Invention

Embodiments of the present invention generally relate to a method for cleaning a semiconductor process chamber and recovering a process chemical.

2. Description of the Related Art

Ruthenium containing precursors are increasingly selected to deposit films for semiconductor processing. As these precursors are used in semiconductor processing equipment, they leave undesirable residue along the surfaces of the equipment. The residue may become friable and contaminate the formed films. The residue may clog the gas distribution assembly that feeds the precursor to the processing chambers, leading to an uneven distribution of precursor across the semiconductor substrate. The residue contains chemicals that, if collected, could be resold in the commodity chemical market. Also, the residue contains chemicals that could be a liability if released into the environment.

A method for determining when the chamber surfaces have accumulated enough residue to detrimentally affect the processing chamber is needed. An effective method and apparatus to remove the residue and a method to determine that the residue has been cleaned from the chamber surfaces are also needed.

SUMMARY OF THE INVENTION

The present invention generally provides a method for cleaning a semiconductor processing chamber including introducing a cleaning gas into a processing chamber, striking a plasma in a remote plasma source that is in communication with the processing chamber, measuring the impedance of the plasma, vaporizing a ruthenium containing deposit on a surface of the processing chamber to form a ruthenium containing gas mixture, and flowing the gas mixture through an analyzer and into an exhaust collection assembly.

The present invention also generally provides an apparatus for cleaning a semiconductor processing chamber including a semiconductor processing chamber, a remote plasma generator in communication with the processing chamber, an impedance measuring device configured to measure a plasma formed by the remote plasma generator, an exhaust collection assembly positioned to collect exhaust gases from the processing chamber, and an analyzer attached to an inlet of the exhaust collection assembly.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION

Figure 1:
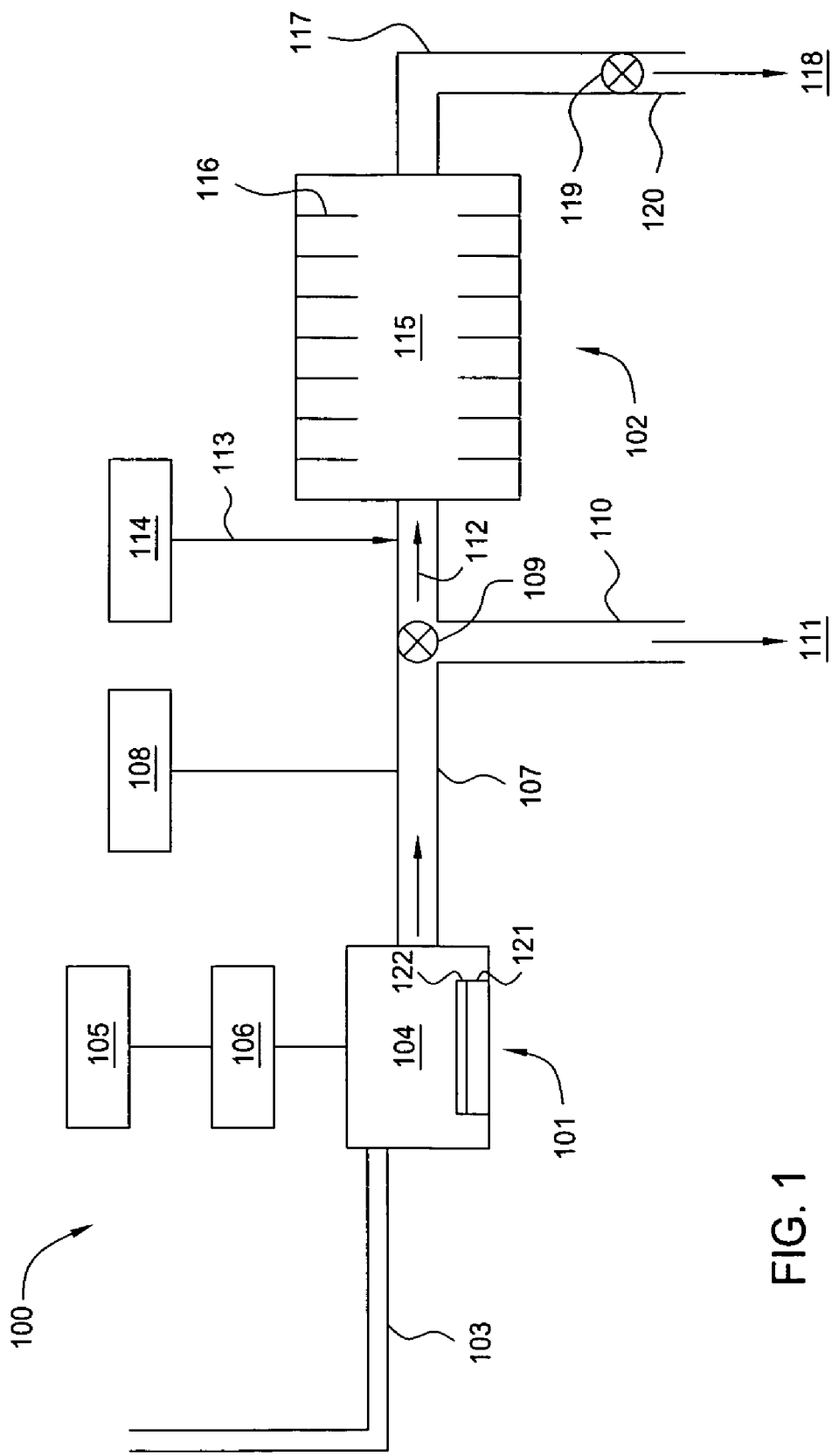
FIG. 1 is a schematic diagram of a semiconductor processing chamber and an exhaust system.

The present invention provides a method of detecting the presence of contaminant deposits in a semiconductor processing chamber, cleaning the chamber, and determining when the chamber cleaning has reduced the contamination deposits to an acceptable level. As a result of repeated exposure to ruthenium containing precursors, the chamber surfaces accumulate multiple deposits. The deposits are often ruthenium oxide ($RuO_2$), a nonvolatile compound, or other nonvolatile ruthenium containing deposits.

The ruthenium containing deposits may have a chemical composition that includes carbon, oxygen, silicon, or other process chemicals. The deposits may be formed from any ruthenium containing precursor. Ruthenium precursors include $Ru(Cp)_2$, $Ru(EtCp)_2$, $Ru(EtCp)$ 2,4, dimethyl pentadienyl, bis(2,4,dimethyl pentadienyl) ruthenium, $Ru(EtCp)$(MeCp), $Ru(THD)_3$, and others, wherein Cp is cyclopentadienyl, Et is ethyl, Me is methyl, and THD is tetramethylheptanedionato. A method for forming a ruthenium material within a high aspect ratio contact (HARC) or other interconnect feature is provided by an atomic layer deposition (ALD) process. In one embodiment, a method for forming a ruthenium material on a substrate includes positioning a substrate within a process chamber and exposing the substrate sequentially to a pyrrolyl ruthenium precursor and a reagent during an ALD process while forming a ruthenium material on the substrate. The pyrrolyl ruthenium precursor contains ruthenium and at least one pyrrolyl ligand with the chemical formula of:

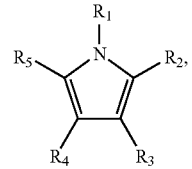

wherein $R_1$, $R_2$, $R_3$, $R_4$ and $R_5$ are each independently selected from hydrogen or an organic group, such as methyl, ethyl, propyl, butyl, amyl, derivatives thereof or combinations thereof. In one example, each $R_2$, $R_3$, $R_4$ and $R_5$ is either a hydrogen group or a methyl group. In another example, each $R_2$ and $R_5$ is a methyl group or an ethyl group.

The pyrrolyl ruthenium precursor may contain a first pyrrolyl ligand and a second pyrrolyl ligand, such that the first pyrrolyl ligand may be the same as or different than the second pyrrolyl ligand. Alternatively, the pyrrolyl ruthenium precursor may contain a first pyrrolyl ligand and a dienyl ligand. For example, the pyrrolyl ruthenium precursor may be a pentadienyl pyrrolyl ruthenium precursor, a cyclopentadienyl pyrrolyl ruthenium precursor, an alkylpentadienyl pyrrolyl ruthenium precursor or an alkylcyclopentadienyl pyrrolyl ruthenium precursor. Therefore, the pyrrolyl ruthenium precursor may be an alkyl pyrrolyl ruthenium precursor, a bis(pyrrolyl) ruthenium precursor, a dienyl pyrrolyl ruthenium precursor or a derivative thereof. Some exemplary pyrrolyl ruthenium precursors include bis(tetramethylpyrrolyl) ruthenium, bis(2,5-dimethylpyrrolyl) ruthenium, bis(2,5-diethylpyrrolyl) ruthenium, bis(tetraethylpyrrolyl) ruthenium, pentadienyl tetramethylpyrrolyl ruthenium, pentadienyl 2,5- dimethylpyrrolyl ruthenium, pentadienyl tetraethylpyrrolyl ruthenium, pentadienyl 2,5-diethylpyrrolyl ruthenium, 1,3-dimethylpentadienyl pyrrolyl ruthenium, 1,3-diethylpentadienyl pyrrolyl ruthenium, methylcyclopentadienyl pyrrolyl ruthenium, ethylcyclopentadienyl pyrrolyl ruthenium, 2-methylpyrrolyl pyrrolyl ruthenium and 2-ethylpyrrolyl pyrrolyl ruthenium.

In another embodiment, a method for forming a ruthenium material on a substrate includes positioning a substrate within a process chamber and exposing the substrate sequentially to an active reagent and a pyrrolyl ruthenium precursor during a plasma-enhanced ALD (PE-ALD) process. Although plasma may be ignited during any time period of the PE-ALD process, preferably, the plasma is ignited while the reagent is exposed to the substrate. The plasma activates the reagent to form an active reagent. Examples of an active reagent include an ammonia plasma, a nitrogen plasma and a hydrogen plasma. One embodiment of the PE-ALD process provides that the plasma is generated external from the process chamber, such as by a remote plasma generator (RPS) system. However, a preferred embodiment of the PE-ALD process provides that the plasma is generated in situ by a plasma capable process chamber utilizing a microwave (MW) frequency generator or preferably, a radio frequency (RF) generator.

In an alternative embodiment, a method for forming a ruthenium material on a substrate includes positioning a substrate within a process chamber and exposing the substrate sequentially to a reagent and a pyrrolyl ruthenium precursor during a thermal-ALD process.

The ruthenium material may be deposited on a barrier layer (e.g., copper barrier) or dielectric material (e.g., low-k) disposed on the substrate during the various ALD processes described herein. The barrier layer may contain a material that includes tantalum, tantalum nitride, tantalum silicon nitride, titanium, titanium nitride, titanium silicon nitride, tungsten or tungsten nitride. In one example, the ruthenium material is deposited on a tantalum nitride material previously formed by an ALD process or a PVD process. The dielectric material may include silicon dioxide, silicon nitride, silicon oxynitride, carbon-doped silicon oxides or a $SiO_xC_y$ material.

Ruthenium deposition and additional precursors are listed and described in U.S. patent application Ser. No. 10/811,230, entitled "Ruthenium Layer Formation for Copper Film Deposition," filed on Mar. 26, 2004, which is incorporated by reference herein. Additional ruthenium containing precursors are listed in U.S. Provisional Patent Application 60/714,580, entitled "Atomic Layer Deposition Processes for Ruthenium Materials," filed Sep. 6, 2005, which is incorporated by reference herein.

Determining when the volume of deposits is great enough to merit performing a cleaning process is challenging. Device performance can not be measured until subsequent processing steps are performed. Visible observation may miss small friable particles that can deform a device. After the gas is introduced in the chamber for an individual substrate deposition sequence, IR measurement of the exhaust gases provides only the chemical composition of the exhaust gases, not a measurement of how much of the ruthenium containing precursor has accumulated on the surface of the substrate or on the chamber surface.

To determine when the chamber has an accumulation of deposits that adversely affect the final device performance of the substrates treated in the chamber, a combination of several apparatus and process measurement devices are configured to measure the chamber and exhaust gas properties. Chambers that may benefit from embodiments of this invention include plasma enhanced atomic layer deposition chambers (PEALD) and atomic layer deposition (ALD) chambers, such as the CENTURA ULTIMA HDP-CVD™, PRODUCER APF PECVD™, PRODUCER BLACK DIAMOND PECVD™, PRODUCER BLOK PECVD™, PRODUCER DARC PECVD™, PRODUCER HARP™, PRODUCER PECVD™, PRODUCER SACVD™, PRODUCER STRESS NITRIDE PECVD™, and PRODUCER TEOS FSG PECVD™ chambers available from Applied Materials, Inc. of Santa Clara, Calif. Additional process chamber information may be obtainied in U.S. patent application Ser. No. 60/733,870, entitled "Apparatus and Process for Plasma-Enhanced Atomic Layer Deposition," filed Nov. 4, 2005 which is incorporated by reference herein. Integrated tools that may include individual process chambers include the ENDURA™ and CENTURA™ integrated tools commercially available from Applied Materials, Inc. of Santa Clara, Calif.

FIG. 1 is a schematic diagram of a semiconductor processing chamber and an exhaust system. The system 100 includes a processing assembly 101 and exhaust assembly 102. The processing assembly has an inlet 103 for introducing process gases into a deposition chamber 104. The deposition chamber 104 is any ALD or CVD chamber, such as those listed above, and contains a substrate support 121 to support a substrate 122. The deposition chamber 104 is connected to a remote plasma source 105.

A VI probe 106 is positioned between the remote plasma source 105 and the deposition chamber 104. The VI probe 106 is a voltage-impedance probe such as the V/I PROBE™ RF impedance analyzer commercially available from MKS Instruments, Inc. of Wilmington, Mass. Alternatively, the VI probe 106 can be positioried within the deposition chamber 104 instead of between the remote plasma source 105 and the deposition chamber 104.

An exhaust outlet 107 extends from the base of the deposition chamber 104. An IR spectrometer 108 is positioned to measure chemical composition in the exhaust outlet 107. The IR spectrometer 108 can be any commercially available infrared spectrometer, such as those sold by the Praxair, Inc. of Danbury, Conn. The IR spectrometer is configured to estimate the $RuO_4$ concentration in the exhaust by measuring the number of Ru—O bonds in the exhaust.

A three way valve 109 is connected to the exhaust outlet 107. A controller (not shown) analyzes the measurements of the IR spectrometer 108 and VI probe 106. The three way valve 109 is positioned to direct gas to a chamber exhaust 110 which extends to an exhaust line 111 which may contain a pump (not shown) or to direct gas to an exhaust recovery line 112. A nitrogen delivery line 113 is connected to the exhaust recovery line 112 to provide nitrogen from nitrogen source 114. The exhaust recovery line 112 is connected to a clean and reclamation chamber 115. The interior of the reclamation chamber 115 has baffles 116. The reclamation chamber 115 has a final exhaust line 117. The exhaust line 117 connects to a two way valve 119. The two way valve 119 also connects to a final exhaust line 120. A pump (not shown) is positioned within an outlet 118 of final exhaust line 120.

In operation, the process conditions for deposition are monitored for plasma effectiveness and efficiency and for exhaust gas composition. As the deposits within the deposition chamber 104 accumulate as more substrates are processed, the plasma formed in the remote plasma source 105 loses impedance. A change in the impedance by about 10 to about 20 percent provides a good indication that the chamber needs to be cleaned.

Also, as the chamber accumulates deposits along the chamber surfaces, there is an increase in the number of particles deposited on the substrate surface. When there are greater than normal number of particles present, the chamber needs to be cleaned. The particle number threshold for cleaning may vary by process and by measurement method. For example, for certain processes, when about 5 to about 50 particles with greater than 0.09 micron dimensions are measured on the substrate surface, the chamber needs to be cleaned.

To measure the number of particles, two sets of about 5 substrates are compared. The first set is a control group that is exposed to inert gases and the second set of substrates is exposed to the precursor gases. The two sets of substrates are tested using a SURFSCAN SP1 DLS™ process and compared. The SURFSCAN SP1 DLS™ process is commercially available from KLA Tencor Corp. of San Jose, Calif. The SURFSCAN SP1 DLS™ process provides an estimate of particle size and number of particles for each particle size. Repeated testing and analysis of the two sets of substrates should provide for a particular process a good estimate of the number of substrates that can undergo ruthenium deposition before chamber cleaning is needed.

Figure 2:
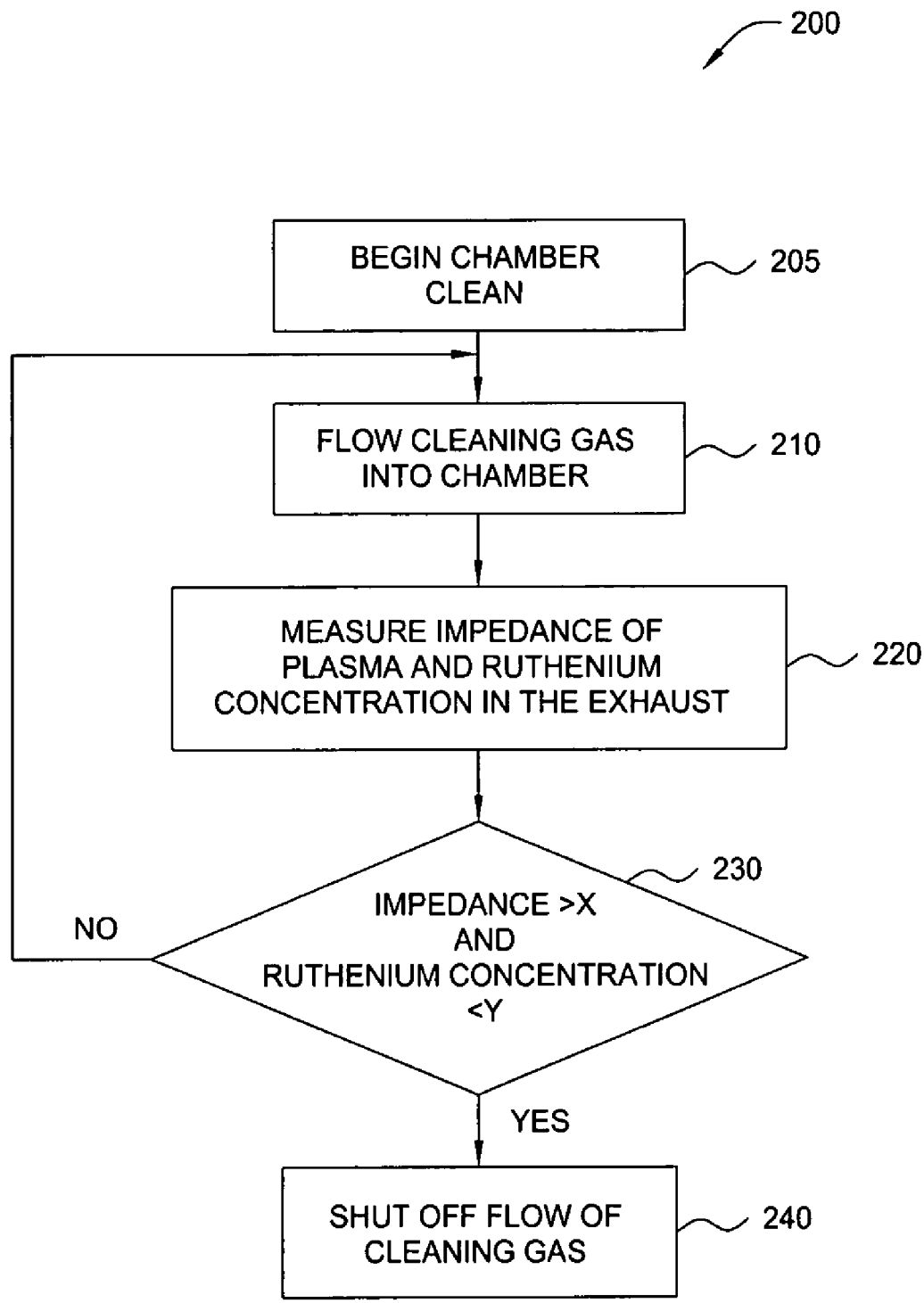
FIG. 2 is a flow diagram of an embodiment of process steps to remove ruthenium containing deposits from surfaces of a chamber.

FIG. 2 is a flow diagram of an embodiment of process steps to remove ruthenium containing deposits from surfaces of a chamber. The cleaning process 200 cleans ruthenium containing deposits from the chamber surfaces. Initially, a substrate is removed from the chamber and process gases are expelled from the chamber during step 205. Step 210 introduces a cleaning gas, such as an oxygen containing precursor, into the deposition chamber 104 (as shown in FIG. 1). The remote plasma source 105 (as shown in FIG. 1) ignites the cleaning gas, and the ionized gas, such as ionized oxygen, reacts with ruthenium and ruthenium oxide ($RuO_2$) to form a more volatile compound, such as ruthenium tetraoxide ($RuO_4$), and the vaporized ruthenium compounds flow from the deposition chamber 104 to the exhaust assembly 102 (as shown in FIG. 1).

During impedance and ruthenium exhaust concentration measurement step 220, the VI probe 106 measures the cleaning plasma impedance and the IR spectrometer 108 measures the volatile ruthenium compound concentration in the exhaust. A controller compares the measured ruthenium concentration and the measured impedance with predetermined values during control step 230. The impedance measurement changes are different during chamber cleaning than the impedance measurement changes observed during deposition. When the measured impedance rises to about five to fifty percent greater or less than the initial impedance measurement, and/or the measured ruthenium concentration lowers to a level less than about thirty to about five percent of the initial ruthenium concentration, such as about ten percent of the initial ruthenium concentration, the controller stops feeding cleaning gases into the deposition chamber in step 240. After the cleaning gases exit the deposition chamber, the process ends. The clean deposition chamber is placed back into service for semiconductor processing.

The cleaning gas may be an oxygen containing precursor such as oxygen, ozone, carbon monoxide, carbon dioxide, or a combination thereof. Ozone may be used in combination with no other precursors or with nitrogen and is often used without plasma in the system. Alternatively, halogen containing precursors may be used such as chlorine or fluorine containing gases, including carbon tetrachloride or carbon tetrafluoride. Halogen containing precursors in low concentration with oxygen may also be used to provide an increased cleaning rate. Furthermore, nitrogen containing gases, such as nitrogen $N_2$, may be used as a precursor gas in combination with other gases to improve the cleaning efficiency.

The process conditions during chamber cleaning are monitored for plasma effectiveness and efficiency and for exhaust gas composition to estimate when the chamber has a sufficiently low amount of chamber deposits so that the cleaning process can be discontinued. Chamber cleanliness can be estimated by the combined conditions of changed impedance and lower concentration of ruthenium containing compounds in the exhaust. Again, the combination of measuring impedance and ruthenium concentration in the exhaust stream provides a more effective estimate of the chamber cleanliness than the individual measurements. The IR measurements for ruthenium in the exhaust as the chamber is cleaned will initially show an increase in ruthenium concentration as the chamber deposits are vaporized and exhausted from the chamber. Then, the concentration of ruthenium in the exhaust decreases indicating the deposits are vaporized and cleaned from the chamber. As the chamber becomes cleaner and fewer deposits are present in the deposition chamber, the impedance of the plasma gradually increases as the plasma effectiveness increases. When cleaning is performed with ozone and no other precursors, chamber cleanliness can be estimated from the concentration of ruthenium containing compounds in the exhaust.

Figure 3:
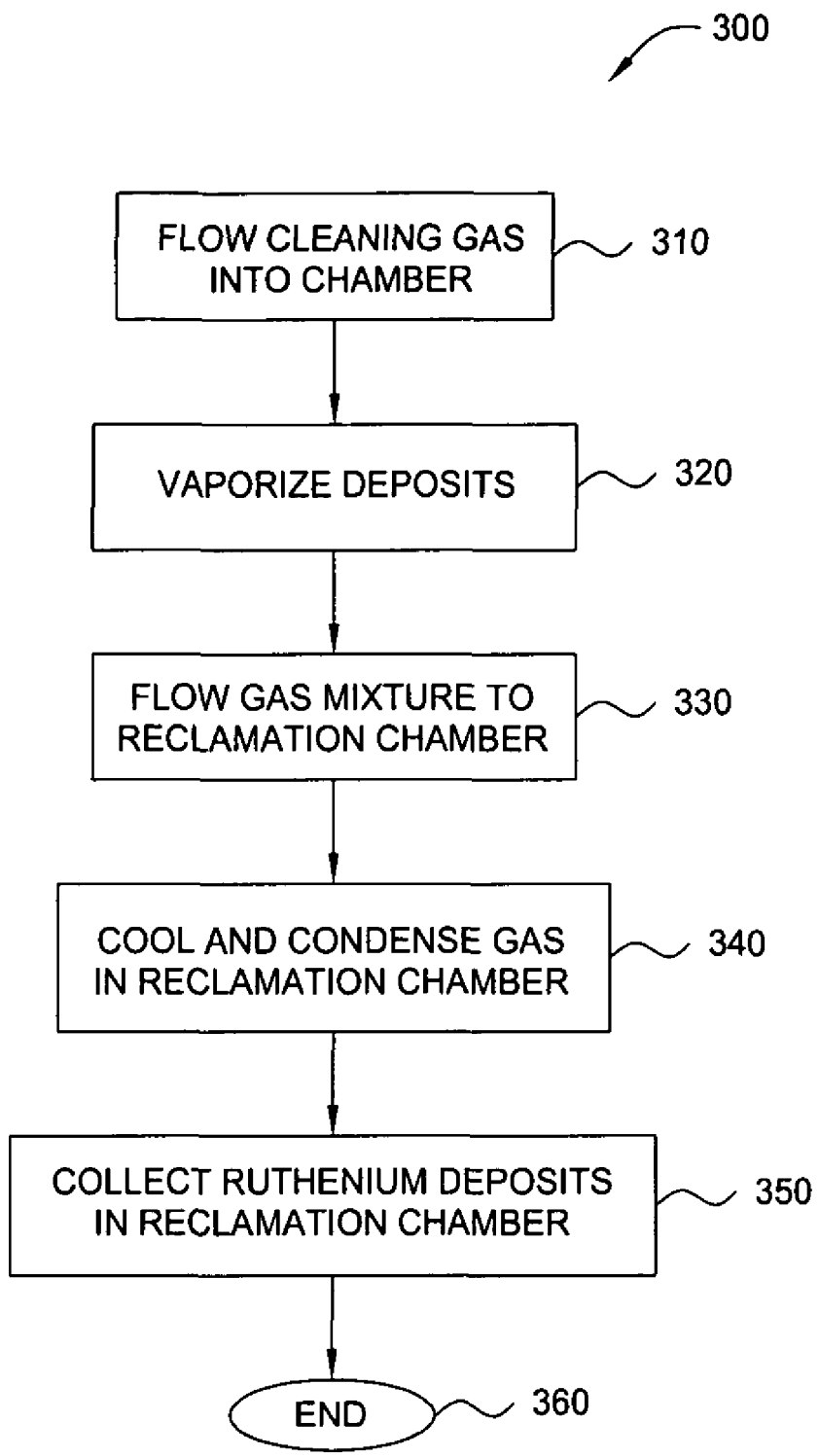
FIG. 3 is a flow diagram of an embodiment of process steps to collect ruthenium oxide deposits in a reclamation chamber.

An advantage of cleaning the deposits out of the deposition chamber is that vaporized ruthenium compounds can be collected in the reclamation chamber. FIG. 3 is a flow diagram of process steps to collect ruthenium oxide deposits in a reclamation chamber. The cleaning and reclamation process 300 begins by flowing cleaning gas into the deposition chamber 104 during cleaning gas step 310. The deposits are vaporized upon exposure to the cleaning gas during step 320. The vaporized deposit and cleaning gas mixture flows from the deposition chamber to the reclamation chamber during gas flow step 330. As the mixture flows from the chamber processing chamber 104, ruthenium oxide ($RuO_4$) may decompose into ruthenium dioxide ($RuO_2$) and deposit on the warm substrate support. That is, the chamber surfaces at about 25° C. to about 85° C. may have deposits that are vaporized by the precursor gases that decompose upon exposure to the substrate support at about 200° C. to about 500° C. To prevent the condensation upon the substrate support, a nonproduction substrate 122 may be inserted on the substrate support to collect the ruthenium dioxide ($RuO_2$). The precursor gases flowing through the chamber will not disturb the condensed material.

Next, the vaporized deposit and cleaning gas flows into the reclamation chamber during decomposition step 340. For example, ruthenium tetraoxide ($RuO_4$) remains in gaseous form until exposed to hot surfaces such as the baffles 116 in the reclamation chamber 115. The reclamation chamber 115 may be configured to have a temperature profile to encourage deposition. The baffles 116 may be selected to form regions that have a controlled temperature gradient. For example, the first set of baffles that the gas encounters may be heated and the second set of baffles cooled. Alternatively, the first set of baffles may be cooled and the second set may be heated.

Next, the ruthenium oxide is recovered from the reclamation chamber 115 during reclamation step 350. Once the deposits have accumulated to a large volume, the reclamation chamber 115 may be isolated by the valves 109 and 119 and the reclamation chamber 115 is submitted to a metals recovery process to recover and market the recovered ruthenium. A pump and purge step may be performed using nitrogen from nitrogen source 114. After the reclamation chamber deposits have been collected, the isolation valves are configured to provide service to the chamber placing it back in service. Thus, the reclamation chamber ruthenium recovery system not only prevents ruthenium from becoming an environmental liability in the fabrication facility exhaust gas system, but also provides the opportunity for ruthenium recovery from a waste stream.

While the foregoing is directed to embodiments of the present invention, other and further embodiments of the invention may be devised without departing from the basic scope thereof, and the scope thereof is determined by the claims that follow.

We claim:

1. A method of cleaning a semiconductor processing chamber containing ruthenium deposits, comprising:
   introducing a cleaning gas into the semiconductor processing chamber, the semiconductor processing chamber having a remote plasma source coupled thereto;
   measuring an impedance of a plasma wherein the measured plasma is located at a position between the remote plasma source and the semiconductor processing chamber;
   measuring a concentration of ruthenium in an exhaust of the semiconductor processing chamber; and
   stopping a flow of the cleaning gas based on the measured impedance and the measured concentration.

2. The method of claim 1, further comprising condensing exhaust gas in a reclamation chamber to collect ruthenium in the exhaust gas.

3. The method of claim 2, wherein the reclamation chamber includes a plurality of baffles that are alternately cooled and heated.

4. The method of claim 1, wherein the flow of cleaning gas is stopped when the measured impedance variation is greater than 5 percent.

5. A method for cleaning a processing chamber, comprising:
   measuring an impedance of a plasma provided to the processing chamber during a deposition process and determining whether the measured impedance is equal to a preselected impedance value wherein, the measured plasma is located at a position between the processing chamber and a remote plasma source coupled thereto;
   introducing a cleaning gas comprising ozone into the processing chamber after the measured impedance is equal to the preselected impedance value;
   vaporizing a ruthenium containing deposit on a surface of the processing chamber to form a ruthenium containing gas mixture; and
   flowing the gas mixture through an analyzer and into an exhaust collection assembly.

6. The method of claim 5, further comprising measuring a concentration of ruthenium using the analyzer.

7. The method of claim 5, further comprising condensing the gas mixture in a reclamation chamber to collect ruthenium in the gas mixture.

8. The method of claim 5, wherein the measuring an impedance is performed with a VI probe.

9. The method of claim 5, wherein the analyzer is an IR spectrometer.

10. A method for cleaning a processing chamber, comprising:
    measuring an impedance of a plasma provided to the processing chamber during a deposition process and determining whether the impedance is equal to a preselected impedance value, wherein the impedance of the plasma is measured and wherein the measured plasma is located at a location between the processing chamber and a remote plasma source coupled thereto;
    introducing a cleaning gas into the processing chamber after the impedance of the plasma is equal to the preselected impedance value;
    vaporizing a ruthenium containing deposit on a surface of the processing chamber to form a ruthenium containing gas mixture;
    flowing the gas mixture through an analyzer and into an exhaust collection assembly; and
    measuring a concentration of ruthenium.

11. A method for cleaning a processing chamber, comprising:
    measuring an impedance of a plasma provided to the processing chamber with a VI probe during a deposition process and determining whether the measured impedance is equal to a preselected impedance value wherein, the measured plasma is located at a position between the processing chamber and a remote plasma source coupled thereto;
    introducing a cleaning gas comprising ozone into the processing chamber after the measured impedance of the plasma is equal to the preselected impedance value;
    vaporizing a ruthenium containing deposit on a surface of the processing chamber to form a ruthenium containing gas mixture;
    flowing the gas mixture through an IR spectrometer and into a reclamation chamber, the IR spectrometer adapted to measure the concentration of ruthenium in the gas mixture;
    condensing the gas mixture in the reclamation chamber to collect ruthenium in the gas mixture; and
    stopping a flow of cleaning gas into the processing chamber based on the measured impedance of the plasma and the measured concentration of ruthenium in the gas mixture.

* * * * *

UNITED STATES PATENT AND TRADEMARK OFFICE
CERTIFICATE OF CORRECTION

PATENT NO. : 7,833,358 B2  
APPLICATION NO. : 11/400663  
DATED : November 16, 2010  
INVENTOR(S) : Chu et al.

Page 1 of 1

It is certified that error appears in the above-identified patent and that said Letters Patent is hereby corrected as shown below:

In the References Cited (56):

Please delete "6,536,602 B2 3/2003 Kopetzky et al." and insert --6,596,602 B2 7/2003 Iizuka et al.-- therefor;

In the Detailed Description:

Column 4, Line 33, please delete "positoried" and insert --positioned-- therefor.

Signed and Sealed this
Fifteenth Day of February, 2011

David J. Kappos
*Director of the United States Patent and Trademark Office*